United States Patent [19]

Sandler

[11] 4,225,896
[45] Sep. 30, 1980

[54] CREST FIRING MEANS

[75] Inventor: Louis M. Sandler, North Reading, Mass.

[73] Assignee: Emhart Industries, Inc., Indianapolis, Ind.

[21] Appl. No.: 886,153

[22] Filed: Mar. 13, 1978

[51] Int. Cl.$^3$ .............................................. H02H 3/20
[52] U.S. Cl. ..................................... 361/56; 307/351; 328/115; 330/207 P; 361/91
[58] Field of Search ....................... 361/56, 91, 88, 89; 307/351, 362, 358, 231, 234; 330/207 P; 328/115, 151, 150

[56] References Cited

U.S. PATENT DOCUMENTS

| 3,083,303 | 3/1963 | Knowles et al. | 361/56 X |
| 3,166,678 | 1/1965 | Fleshman, Jr. et al. | 307/351 |
| 3,176,148 | 3/1965 | Lampke | 307/351 |
| 3,293,451 | 12/1966 | Henning et al. | 307/351 |
| 3,891,895 | 6/1975 | Wittlinger | 307/351 X |
| 4,038,568 | 7/1977 | May et al. | 307/358 X |

OTHER PUBLICATIONS

IBM Technical Disclosure Bulletin, vol. 15, No. 8, Jan. 1973–"Peak Detector", by C. H. Ristad, p. 2377.

Primary Examiner—Patrick R. Salce
Attorney, Agent, or Firm—Hoffmann & Meyer

[57] ABSTRACT

Disclosed herein is an improved means for detecting a half-cycle voltage crest of an alternating voltage waveform which includes means for protecting the detecting means from current surges associated with the initial random application of the alternating voltage waveform to the detecting means.

3 Claims, 4 Drawing Figures

CREST FIRING MEANS

BACKGROUND OF THE INVENTION

1. Field of the Invention

The present invention relates to means for applying power to an AC load at the crest of an alternating voltage waveform to thereby prevent current surges during activation of the AC load and is more particularly concerned with means for detecting a half-cycle voltage crest of the alternating voltage waveform.

Generally speaking, the present invention is an improvement upon means for detecting a half-cycle voltage crest of an alternating voltage waveform where the improvement includes a means for protecting the detecting means from current surges associated with the initial random application of the alternating voltage waveform to the detecting means.

2. Description of the Prior Art

With certain types of AC loads and particularly with those requiring a substantial amount of power for initial activation if not activated at the crest of an alternating voltage waveform such as the primary winding of a transformer used to drive a magnetron power supply in a microwave oven, a means must be employed to limit current surges during start-up; otherwise, fuses and circuit breakers used to prevent excessive start up current flow would be continuously thrown open as a result of excessive current being drawn by the load or in the absence of a fuse, circuit breaker, or other means for preventing excessive current flow, wiring and/or the AC load itself may be damaged. One method of preventing such surges is by activation of the load at the crest or peak voltage of the alternating voltage waveform. Alternatively, rather than attempt to have the load activate or draw power for activation at the crest of the alternating voltage waveform, a current limiting device such as a resistance means will be electrically coupled in series with the load to prevent current surges. However, the larger the value of the resistance means, the smaller the current available to provide the necessary power to operate the load. An additional switching device may be used to shunt the resistance means and apply full power to operate the load.

The present invention provides a means for detecting a half-cycle voltage crest of the alternating voltage waveform so that power may be applied to the AC load at the voltage crest thereby minimizing or eliminating current surges during activation of the load. Most prior art peak detector circuits are very sensitive to component values of the circuit and/or require complex logic circuitry to control the on and off switching of an AC load as a result of their inability to completely assure that all enabling signals will be provided at voltage crests. To overcome these problems, a means for detecting a half-cycle voltage crest of an alternating voltage waveform is disclosed in U.S. patent application, Ser. No. 865,309 entitled "Variable Power and Temperature Control System For Appliances And The Like" (See FIG. 1 of the present disclosure) which employs a capacitor having a discharge time constant which is substantially longer than a period of the alternating voltage waveform and a transistor for applying the alternating voltage waveform to the capacitor at substantially the half-cycle voltage crest of the alternating voltage waveform which also produces a signal indicating the voltage crest when applying the alternating voltage waveform. By this means a "window" of time extending from just before to just after the peak of the AC line voltage is formed during which power may be applied to the AC load.

Although the circuit disclosed in U.S. application, Ser. No. 865,309 alleviates the current surge problem during the initial activation of the AC load, if the AC line voltage (alternating voltage waveform) is suddenly applied to the circuit disclosed in U.S. application, Ser. No. 865,309 at a random phase of the alternating voltage waveform a current surge will be applied to the base of the transistor thereby damaging the transistor. Accordingly, a current surge problem still remains during the activation of the means which was devised to eliminate current surges during the activation of the AC load. By improving upon the design of the prior art circuit shown in FIG. 1, the remaining current surge problem can be alleviated.

SUMMARY OF THE INVENTION

In accordance with the present invention in its broadest concept, there is provided an improved means for detecting a half-cycle voltage crest of an alternating voltage waveform which eliminates current surge problems when power is suddenly applied to the means for detecting the voltage crest at a random phase of the alternating voltage waveform.

Accordingly, it is a feature of the present invention to improve a means for detecting a half-cycle voltage crest of an alternating voltage waveform of the type which includes at least one capacitive element having a discharge time constant which is substantially longer than a period of the alternating voltage waveform and means responsive to the alternating voltage waveform and to the discharge rate of the capacitive element for applying the alternating voltage waveform to the capacitive element at substantially the half-cycle crest of the alternating voltage waveform whereby a signal is produced indicating the half-cycle voltage crest wherein the improvement includes means for protecting the means for applying the alternating voltage waveform from current surges associated with large voltage amplitudes when responding to the alternating voltage waveform.

It is another feature of the present invention to provide a means for detecting a half-cycle voltage crest of an alternating voltage waveform which is insensitive to current surge problems.

It is still another feature of the present invention to provide an improved method of detecting a half-cycle voltage crest of an alternating voltage waveform which eliminates current surge problems wherein the improvement includes the step of shunting surges away from the means for detecting the half-cycle voltage crest.

Other features and advantages of the present invention will be apparent from the following detailed description of preferred embodiments thereof, which description should be considered in conjunction with the accompanying drawings.

DESCRIPTION OF THE PREFERRED EMBODIMENT

Figure 1:
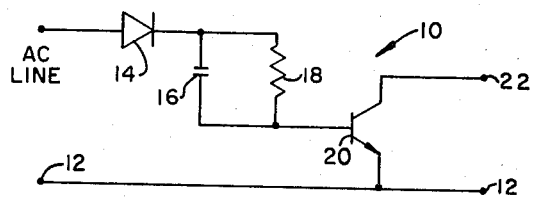
FIG. 1 is a schematic illustration of a conventional means for detecting a half-cycle voltage crest of an alternating voltage waveform.

Referring to FIG. 1, there is shown in an electrical schematic form using conventional symbols for known components a means 10 for detecting a half-cycle voltage crest of an alternating voltage waveform provided by the AC line of the type disclosed in U.S. patent application, Ser. No. 865,309 entitled, "Variable Power and Temperature Control System For Appliances And The Like." Peak detector 10 includes a diode 14 which provides half-wave rectification of the AC voltage produced by the AC line, a bipolar semiconductor switching device 20 which as illustrated is an NPN transistor having its emitter electrically coupled to ground potential 12, its collector electrically coupled to the output 22 of peak detector 10, and its base electrically coupled through the parallel combination of a resistor 18 and a capacitor 16 to the cathode of diode 14 which as previously indicated forms a half-wave rectifier. Peak detector 10 detects and signals the crest of each half-cycle of the AC line voltage.

In operation, the base-emitter junction of bipolar semiconductor switching device 20 in combination with diode 14 acts as a rectifier which charges capacitor 16 to substantially the peak of the voltage of the alternating voltage waveform supplied by the AC line. The time constant associated with the RC network comprising resistor 18 and capacitor 16 is very long; therefore, when diode 14 and the base-emitter junction of bipolar semiconductor switching device 20 are nonconducting following a crest or peak of the alternating voltage waveform, capacitor 16 will discharge very slowly. As soon as the magnitude of the alternating waveform voltage exceeds the magnitude of the voltage of capacitor 16, the base-emitter junction of switching device 20 and diode 14 will conduct and therefore recharge capacitor 16 to the crest or peak of the alternating voltage waveform. Accordingly, for a period at the crest of the alternating voltage waveform of the AC line when the base-emitter junction of switching device 20 and diode 14 are conducting to recharge capacitor 16, a current pulse will flow through the base of switching device 20 thereby causing a signal to appear at its collector (output 22).

Since capacitor 16 discharges slowly from a value substantially equal to the peak voltage of the alternating voltage waveform, the point where the magnitude of the voltage of the alternating waveform exceeds the magnitude of the voltage of capacitor 16 will be very near the peak voltage of the alternating waveform. The base-emitter junction of switching device 20 will discontinue conducting when the magnitude of the voltage of the alternating waveform decreases at a faster rate after reaching a peak than the capacitor 16 discharges. Because of the slow discharge rate of capacitor 16, the base-emitter junction of switching device 20 will discontinue conducting very near the peak voltage of the alternating waveform. Accordingly, for a brief time before, at, and after the peak voltage of the alternating waveform a pulse of current to recharge capacitor 16 will pass through the base of switching device 20 which causes a simultaneous pulse of current to pass through the collector of switching device 20 which is large enough to saturate the switching device 20 and produce a signal at the output 22 of peak detector 10. A "window" of time extending from just before to just after the voltage crest is formed during which power may be applied to a load.

It should be noted that in order to create this "window" of time around the voltage crest of the alternating waveform, the RC time constant derived from capacitor 16 and resistor 18 must be substantially greater than the period of the alternating voltage waveform. As long as this condition exists, specific values for the components of peak detector 10 are not critical.

While the peak detector 10 illustrated in FIG. 1 solves the problem of current surges during the activation of a load, no provisions are made for protecting peak detector 10 from current surges when it is initially activated. If the alternating voltage waveform produced by the AC line is suddenly applied at a random phase of the waveform where the instantaneous voltage amplitude is large and positive, a large surge of current will flow into the base of switching device 20 which may damage it. Accordingly, a purpose of our present invention is to improve the peak detector 10 by providing a means for protecting it from current surges during its initial activation.

Referring now to FIGS. 2, 3, 4, and 5 there are shown various embodiments of my improvement to peak detector 10 (FIG. 1). Where the same components of peak detector 10 (FIG. 1) are repetitively illustrated in FIGS. 2, 3, 4, and 5 the same identifying numerals have been used to identify corresponding components; therefore, unless otherwise necessary to describe the various embodiments of my invention, a further discussion of these common components will not appear hereinafter.

Figure 2:
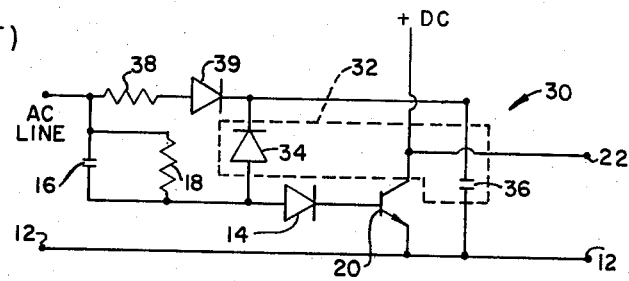
FIG. 2 is a schematic illustration of an embodiment of the improvement of the present invention.

Referring now to FIG. 2, there is illustrated an improved means 30 for detecting a half-cycle voltage crest of an alternating voltage waveform wherein my improvement includes a means 32 for protecting the switching device 20 from current surges. Although diode 14 has been relocated, it performs the same function as diode 14 illustrated in FIG. 1 since it is still electrically coupled in series with the base of switching device 20. Typically, there will be included in combination with peak detector 30 a resistor 38 and a capacitor 36 electrically coupled in series with a diode 39 to filter and rectify respectively the alternating voltage waveform produced by the AC line. This filtering and rectifying results in a relatively smooth DC voltage waveform at capacitor 36 which is typically used as a power supply for additional circuitry. As illustrated in FIG. 2, the embodiment of my invention for eliminating the above described current surge problem includes capacitor 36 and a diode 34 having its cathode electrically coupled to the DC voltage waveform at capacitor 36 and its anode electrically coupled to the cathode of diode 14. Before power is applied to peak detector 30, the capacitor 36 will be discharged. Diode 34 is a high current rectifier which should be capable of sustaining high currents. Accordingly, when power is initially applied to peak detector 30, diode 34 shunts any current surges resulting therefrom away from diode 14 and the base of switching device 20 to capacitor 36. Capacitors 16 and 36 form an AC voltage divider network; therefore, if the ratio of the capacitance of capacitor 36 to the capacitance of capacitor 16 is sufficiently large, diode 14 will not conduct when power is initially applied to peak detector 30 thereby eliminating the possibility of any current surges reaching the base of switching device 20. Since capacitor 36 would usually already be present and have a capacitance value which is substantially larger than the capacitance value of capacitor 16, my improvement adds very little cost to the peak detector 10 illustrated in FIG. 1.

Figure 3:
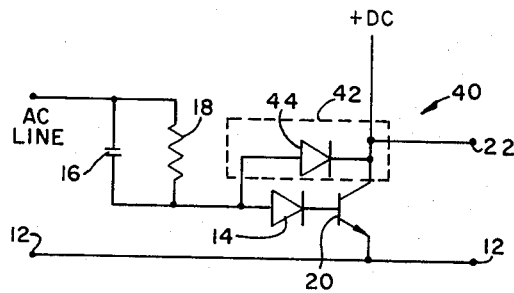
FIG. 3 is a schematic illustration of another embodiment of the improvement of the present invention.

Referring to FIG. 3, there is shown another embodiment of a means 40 for detecting a half-cycle voltage crest of an alternating voltage waveform wherein my improvement includes a means 42 for protecting the switching device 20 from current surges. Again, diode 14 performs the same function as diode 14 shown in FIG. 1. In this embodiment of my invention, means 42 for protecting the switching device 20 includes a diode 44 which is a high current rectifier having its cathode electrically coupled to the collector of switching device 20 and its anode electrically coupled to the base of switching device 20 through diode 14. Diode 44 is therefore electrically coupled in parallel with the base-collector junction of switching device 20 and diode 14. Typically, the collector of a bipolar semiconductor switching device 20 is capable of withstanding much higher currents (such as the current surges aforementioned) than the base of the switching device. Accordingly, by utilizing the circuit configuration shown in FIG. 3, excessive current is shunted away from diode 14 and the base of switching device 20 through diode 44 to the collector of switching device 20. An additional advantage of the embodiment illustrated in FIG. 3 is a decrease in the pulse width of the signal appearing at the output 22. This decrease in the output pulse width results from the effect of a smaller resistance in series with capacitor 16, i.e. a single diode 44 rather than a diode 14 and the base-emitter junction of switching device 20 (FIG. 2).

Figure 4:
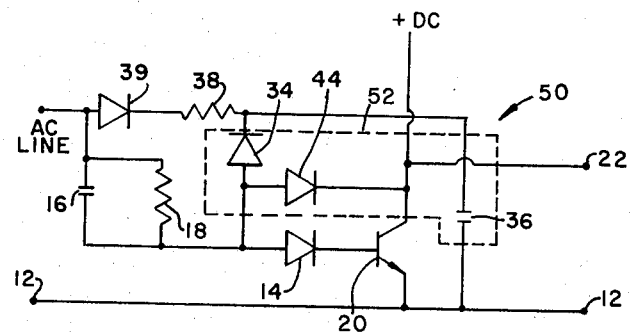
FIG. 4 is a schematic illustration of still a further embodiment of the improvement of the present invention.

Referring now to FIG. 4, another embodiment of a means 50 for detecting a half-cycle voltage crest of an alternating voltage waveform is illustrated wherein the improvement includes a means 52 for protecting the switching device 20 from current surges. This embodiment of my invention combines the embodiments shown in FIGS. 2 and 3 to provide a means 50 for detecting a half-cycle voltage crest which has all of the advantages of both of the previously described embodiments. As shown in FIG. 4, means 52 for protecting the switching device 20 includes a diode 34 which is a high current rectifier and a capacitor 36 each of which are electrically coupled as described for FIG. 2 hereinabove and a diode 44 electrically coupled as previously described for FIG. 3. In the embodiment shown in FIG. 4, diode 44 would preferably be a low current signal diode; otherwise the circuit and operation thereof are the same as the combined descriptions for FIGS. 2 and 3.

In view of the above description, it will be seen that the several objects of my invention are achieved and other advantageous results attained and that further modifications can be made without departing from the spirit and scope of the invention as defined in the appended claims.

What I claim is:

1. In a means for detecting a half-cycle voltage crest of an alternating voltage waveform of the type including at least one capacitive element having a discharge time constant which is substantially longer than a period of said alternating voltage waveform and means responsive to said alternating voltage waveform and to the discharge rate of said capacitive element for applying said alternating voltage waveform to said capacitive element at substantially said half-cycle voltage crest of said alternating voltage waveform whereby a signal is produced indicating said half-cycle voltage crest, the improvement comprising: means for protecting said means for applying said alternating voltage waveform to said capacitive element from current surges associated with changes in voltage amplitudes of said alternating voltage waveform, said means for protecting including, first means for shunting said current surges away from said means for applying, said first means for shunting being electrically coupled to said means for applying said alternating waveform to said capacitive element, and second means for shunting said current surges including a second capacitive element and being electrically coupled in parallel with said first means for shunting.

2. In a means for detecting a half-cycle voltage crest of an alternating voltage waveform of the type including at least one capacitive element having a discharge time constant which is substantially longer than a period of said alternating voltage waveform and means responsive to said alternating voltage waveform and to the discharge rate of said capacitive element for applying said alternating voltage waveform to said capacitive element at substantially said half-cycle voltage crest of said alternating voltage waveform whereby a signal is produced indicating said half-cycle voltage crest, the improvement comprising: means for protecting said means for applying said alternating voltage waveform to said capacitive element from current surges associated with changes in voltage amplitudes of said alternating voltage waveform, said means for protecting including means for shunting said current surges, said means for shunting including a second capacitive element and a diode having its cathode electrically coupled to said second capacitive element and its anode electrically coupled to said means for applying said alternating waveform.

3. The improvement as recited in claim 2, wherein said means for protecting further includes a second means for shunting said current surges, said second means for shunting including a diode having its cathode electrically coupled to an output of said means for applying said alternating waveform and its anode electrically coupled to said anode of first said means for shunting said current surges.

* * * * *